(12) United States Patent
Suzuki

(10) Patent No.: US 10,048,716 B1
(45) Date of Patent: Aug. 14, 2018

(54) METHOD AND APPARATUS FOR POWER DISTRIBUTION IN INTEGRATED CIRCUITS

(71) Applicant: Apple Inc., Cupertino, CA (US)

(72) Inventor: Shingo Suzuki, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/429,788

(22) Filed: Feb. 10, 2017

(51) Int. Cl.
  *G05F 3/02* (2006.01)
  *H01L 23/498* (2006.01)

(52) U.S. Cl.
  CPC .......... *G05F 3/02* (2013.01); *H01L 23/49816* (2013.01)

(58) Field of Classification Search
  None
  See application file for complete search history.

(56) References Cited

U.S. PATENT DOCUMENTS

| | | | |
|---|---|---|---|
| 8,786,080 B2 | 7/2014 | Lim | |
| 8,946,905 B2 | 2/2015 | Masleid | |
| 9,355,960 B2 | 5/2016 | Hsieh | |
| 2014/0346930 A1* | 11/2014 | Kohda | H01L 41/0533 310/344 |
| 2016/0155692 A1 | 6/2016 | Dosluoglu | |
| 2017/0213860 A1* | 7/2017 | Ukigaya | H01L 27/1463 |
| 2018/0061811 A1* | 3/2018 | Shen | H01L 25/0657 |

* cited by examiner

*Primary Examiner* — Lincoln Donovan
*Assistant Examiner* — Khareem E Almo
(74) *Attorney, Agent, or Firm* — Meyertons, Hood, Kivlin, Kowert & Goetzel, P.C.

(57) ABSTRACT

A method and apparatus for distributing power in an integrated circuit (IC) is disclosed. The IC includes at least one electrically conductive bump coupled to a true voltage node. Power may be distributed to the IC from an external power source coupled to the bump. The integrated circuit further includes a virtual voltage node. A power switch may be implemented, with the power switch being located directly beneath the bump. A first vertical connector may couple one portion of the power switch to the bump, while a second vertical conductor may couple another portion of the switch to the virtual voltage node.

20 Claims, 10 Drawing Sheets

US 10,048,716 B1

METHOD AND APPARATUS FOR POWER DISTRIBUTION IN INTEGRATED CIRCUITS

BACKGROUND

Technical Field

This disclosure is directed to integrated circuits, and more particularly, to power distribution in integrated circuits.

Description of the Related Art

Many modern integrated circuits include a number of virtual voltage domains, which include circuitry that may be switched off when idle. The switching off of such circuitry may be accomplished by deactivating a power switch coupled between a corresponding virtual voltage node (from which the circuits receive power) and a true voltage node.

Integrated circuits may use various arrangement to effect power distribution to virtual voltage nodes. In many integrated circuits, power may be distributed from a true, or global voltage node, along a metal layer, to individual transistors of a power switch. These transistors may be distributed throughout various portions of the integrated circuit. The particular point on the integrated circuit wherein the true voltage node may be coupled to an external power supply may vary, and may be driven by the overall layout. Multiple bumps for connecting an external power supply may be placed on a surface layer of the integrated circuit, which power being distributed along a correspondingly coupled metal layer, to the transistors of the power switch, and eventually to the virtual voltage node.

SUMMARY

A method and apparatus for distributing power in an integrated circuit (IC) is disclosed. In one embodiment, an integrated circuit includes at least one electrically conductive bump implementing a true voltage node. Power may be distributed to the IC from an external power source coupled to the bump. The integrated circuit further includes a virtual voltage node on a metal layer. A power switch may be implemented, the power switch being located directly (vertically) beneath the bump. A first vertical connector may couple one portion of the power switch to the bump, while a second vertical conductor may couple another portion of the switch to the virtual voltage node.

In one embodiment, a first metal layer may implement a portion of the true voltage node, while a second metal layer may implement at least a portion of a virtual voltage node. The transistors of the power switch may be located just beneath a third metal layer, which may be a bottom metal layer of the IC.

In one embodiment, a second virtual voltage node may be implemented on the IC, with a second power switch also implemented, on the third metal layer, directly below the bump. Generally speaking, multiple power switches may be implemented below the bump, with multiple, separate, virtual voltage domains being implemented on the second metal layer. However, in some embodiments, as few as one power switch may be implemented below the bump.

Each power switch may be implemented with one or more transistors. In an embodiment in which a power switch is implemented with multiple transistors, the transistors may be activated in a sequential manner (i.e. one transistor after another) to couple the true voltage node to the correspondingly coupled virtual voltage node. Each virtual voltage node may distribute power to functional circuits of a corresponding voltage domain.

Due to the arrangement disclosed herein, power may be conveyed from the bump to the power switch on a conductor that is entirely vertical (with respect to the surface of the IC), with no transmission of power from the bump to the power switch carried out horizontally. Similarly, power from an activated power switch may be conveyed from the power switch to a corresponding virtual voltage node on another conductor that is entirely vertical. Power may then be distributed to functional circuit blocks horizontally along the portion of the second metal layer that implements the corresponding virtual voltage node.

The first metal layer may be a top metal layer of the IC. The fourth metal layer may be a next metal layer below the first metal layer, while the second metal layer may be a next metal layer below the fourth. The third metal layer may be the bottom metal layer of the IC. The fourth metal layer may be non-contiguous. Portions of the fourth metal layer may be coupled to the true voltage node on the first metal layer, other portions may be coupled to the virtual voltage node one the second metal layer, and while other portions may be coupled to a return path (e.g., ground or Vss). The pitch of the first and second metal layers may be at the bump pitch, while the pitch of the portions of the fourth metal layer may be at a narrow pitch.

BRIEF DESCRIPTION OF THE DRAWINGS

The following detailed description makes reference to the accompanying drawings, which are now briefly described.

Figure 1:
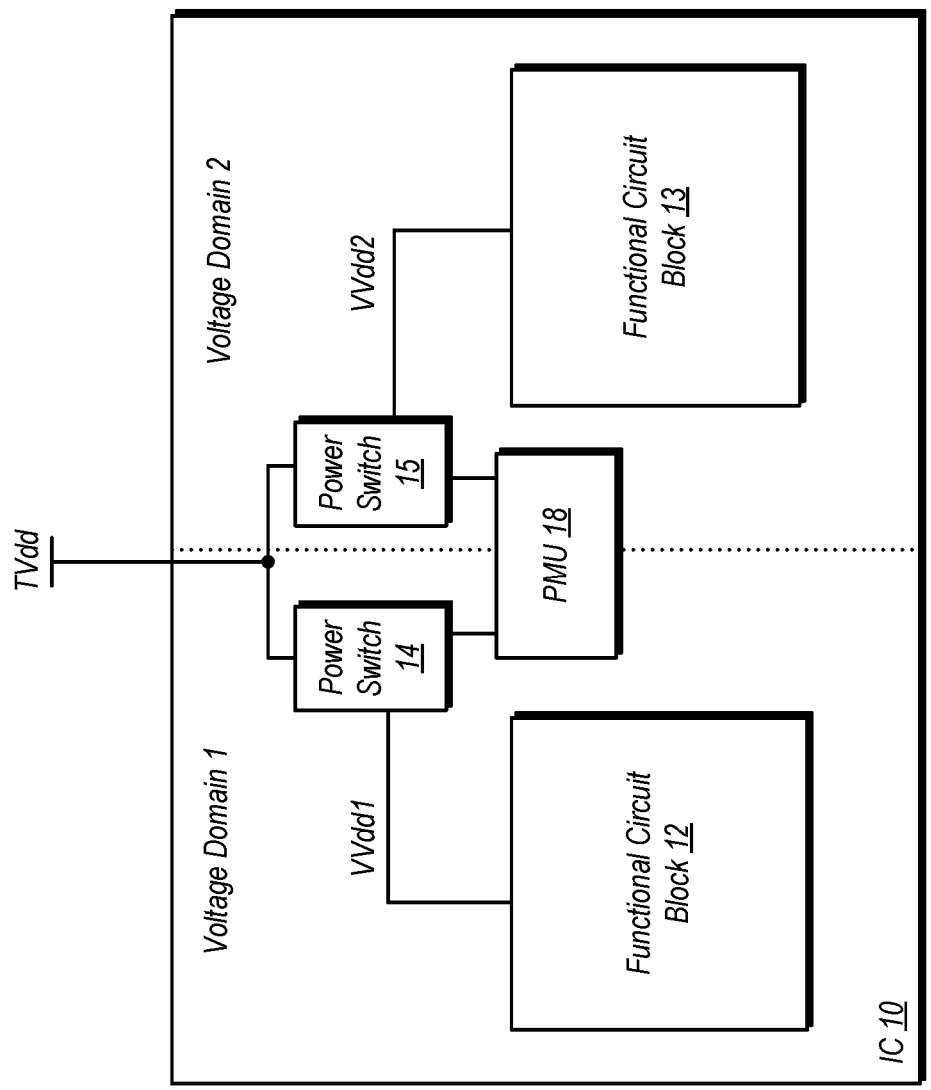
FIG. 1 is a block diagram of one embodiment of an integrated circuit (IC).

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Turning now to FIG. 1, a block diagram of an exemplary integrated circuit (IC) is shown. In the illustrated embodiment, IC 10 includes two voltage domains, Voltage Domain 1 and Voltage Domain 2. Functional circuit block 12 is implemented in Voltage Domain 1, and includes a number of circuits configured to operate according to the voltage received on a first virtual voltage node (VVdd1, or virtual Vdd 1). Functional circuit block 13 is implemented in Voltage Domain 2, and includes a number of circuits configured to operate according to the voltage received on a second virtual voltage node (VVdd2, or virtual Vdd 2). Although not explicitly shown, voltage regulators that can control the amplitude of the supply voltages in their respective voltage domains may also be included in the corresponding functional circuit blocks. Thus, the voltages on the virtual voltage nodes may be adjustable.

Both VVdd1 and VVdd2 may receive their respective voltages from the True Vdd node, TVdd, via respective power switches. Power switch 14 may, when active, allow the voltage present on the true Vdd node to be provided to VVdd1. Power switch 15 may similarly, when active allow VVdd2 to receive voltage from TVdd. Power switches 14 may be activated or deactivated under the control of power management unit (PMU) 18. In the embodiment shown, PMU 18 may implement various circuitry that can control the state of power switches 14 and 15, among other power control and monitoring functions.

The distribution of voltage from TVdd to VVdd1 and VVdd2 may occur according to the power distribution scheme to be discussed herein. This power distribution scheme is directed to the placement of the power switches, bumps for receiving power on TVdd from a source external to IC 10, and the implementation of voltage nodes on various metal layers of IC 10. This arrangement may allow for more efficient power distribution to the various functional circuits of IC 10, as may provide additional benefits over traditional power distribution schemes, as will be discussed in further detail below.

Figure 2:
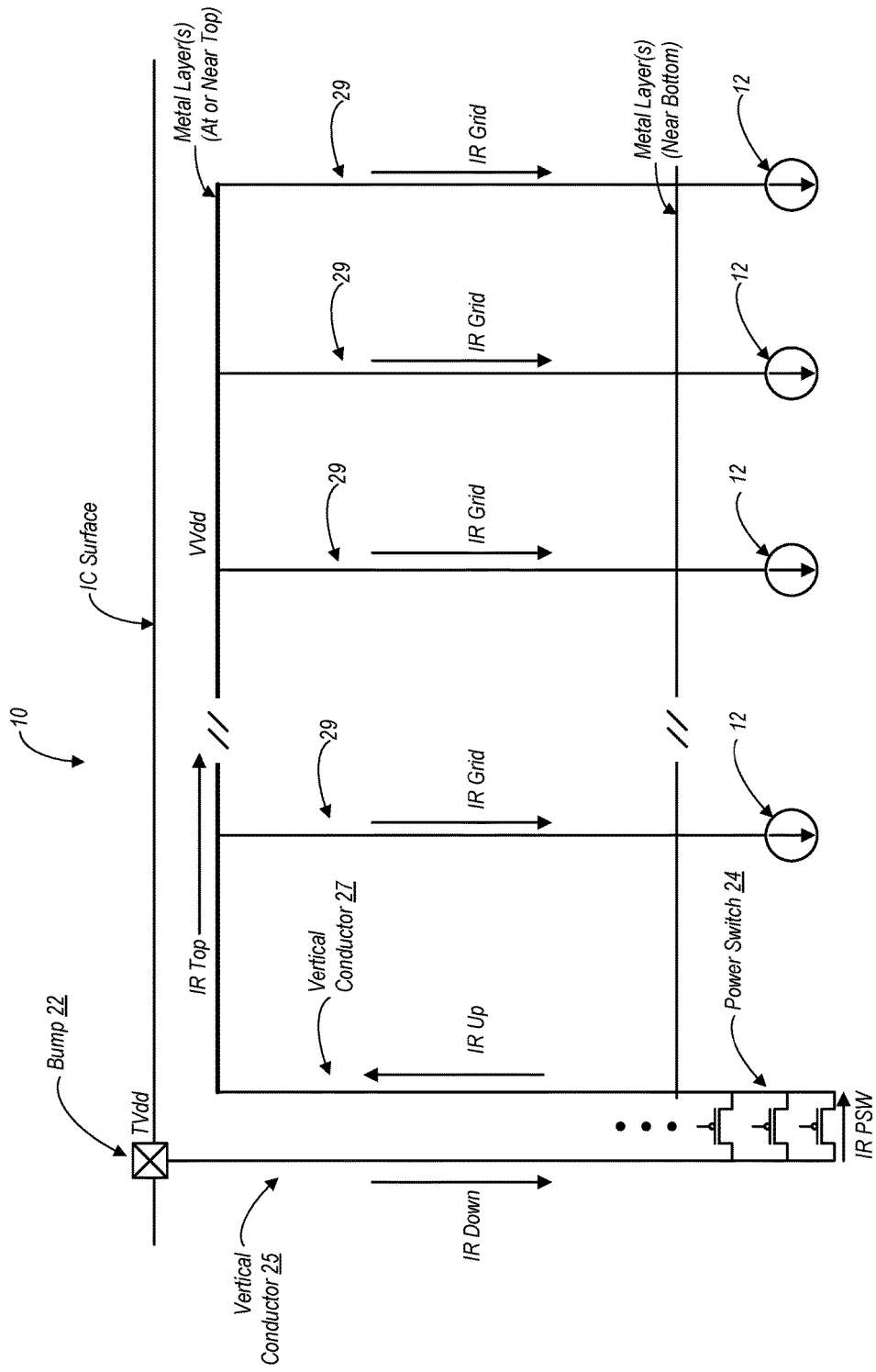
FIG. 2 is an illustration of a power distribution scheme in one embodiment of an IC.

FIG. 2 is an illustration of a power distribution scheme in one embodiment of an IC. In the embodiment shown, IC 10 includes a bump 22 that may be coupled to an external voltage source, thereby implementing at least a portion of a true Vdd (TVdd) node. Current drawn by the various loads in IC 10 may flow directly downward (e.g., perpendicular to the surface of IC 10) through vertical conductor 25 to power switch 24. The IR drop for this portion of the power distribution network is represented by IR Down. Power switch 24 in the embodiment shown may thus be implemented directly below bump 22, and may also be beneath the bottom metal layers of IC 10. These bottom metal layers may be used for, among other things, to connect circuits to one another. This may include connecting power switch 24 to vertical conductors 25 and 27.

When power switch 24 is active, TVdd is electrically coupled to a virtual voltage node, or VVdd. Current may then flow through vertical conductor 27 up to the VVdd node. The IR drop for this portion of the power distribution network is represented by IR Up. The VVdd node in the embodiment shown may be implemented on one or more upper metal layers of IC 10. These metal layers may include the top metal layer and/or other metal layers. From vertical conductor 27, current may flow on the one or more metal layers implementing VVdd to additional vertical conductors 29. The IR drop in this portion of the power distribution network is represented by IR Top. From VVdd, current may flow to the various functional circuit blocks 12 via correspondingly coupled ones of vertical conductors 29. The IR drop for these portion of the power distribution network are represented by IR Grid. The various circuits of the functional circuit blocks 12 may also be implemented below the bottom metal layers of IC 10, with these metal layers providing interconnections there between.

Figure 3:
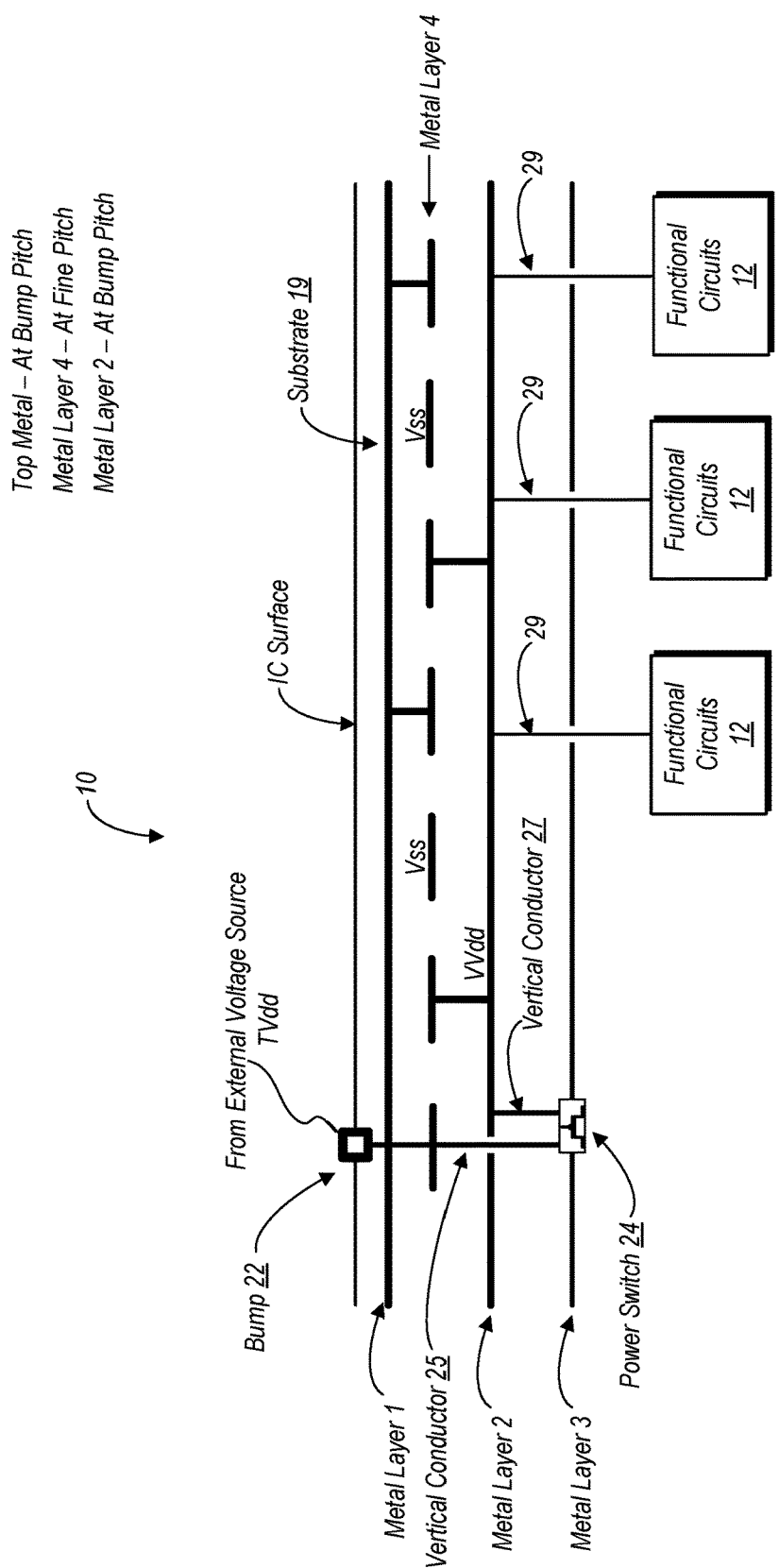
FIG. 3 is a side view of one embodiment of an IC illustrating metal layers separated by a substrate.

Turning now to FIG. 3, a side view of one embodiment of an IC illustrating metal layers separated by a substrate is shown. IC 10 as illustrated in FIG. 2 includes multiple metal layers, although only the four are shown here for the sake of simplicity. It is further noted that while FIG. 2 makes references to only a single virtual voltage node (VVdd), the power distribution scheme discussed herein may be applied to embodiments having multiple voltage domains, and thus, multiple virtual voltage nodes. Furthermore, it is noted that the metal layers shown here are not intended to be conveyed as being contiguous throughout IC 10, but instead may have multiple gaps therein, e.g., to implement separate and distinct virtual voltage nodes. In various embodiments, each of the metal layers may be implemented in strips, with the orientation of metal strips on one layer being either parallel or perpendicular with respect to metal strips on another layer. As shown herein, vertical separation between the metal layers is provided by substrate 19.

In the embodiment shown, bump 22 is implemented on the surface of IC 10. Bump 22 as shown herein comprises the true voltage node, or TVdd. When IC 10 is implemented in its final packaging, wiring may be coupled to bump 22 (e.g., by soldering or other suitable mechanism) to couple an external voltage source to IC 10. While only a single bump 22 is shown here for the sake of illustration, in various embodiments, IC 10 may include multiple instances of bump 22 to implement connections for the true voltage node. Bump 22 in the embodiment shown is both physically and electrically coupled to a first metal layer, Metal Layer 1. Thus, Metal Layer 1 may implement a TVdd node. Although not explicitly shown in this drawing, additional bumps for coupling to a return path (e.g., Vss) may also be implemented on the IC surface. Portions of Metal Layer 1 may be isolated from the TVdd node, and coupled to the Vss bump, thus implementing a Vss node on Metal Layer 1 as well.

Power switch 24 in the embodiment shown is implemented substantially and directly beneath bump 22, as transistors just beneath (and coupled to) Metal Layer 3, which may be a bottom metal layer of IC 10 (although not shown, in some embodiments, additional metal layers may be present between Metal Layer 2 and Metal Layer 3). Vertical conductor 25 provides an electrical connection between bump 22 and one side of power switch 24. The placement of power switch 34 directly and vertically beneath bump 22 from which TVdd is received, there is no substantial current flow on Metal Layer 1 (and thus, negligible IR drop, where I is current and R is the resistance of the metal in the conductors).

Voltage on TVdd may be transferred to a second vertical conductor 27 and to the virtual voltage node, VVdd, when power switch 24 is activated. Accordingly, the amount of current flow (and IR drop) on Metal Layer 3 is minimized. The voltage from the activated power switch may be conveyed on vertical conductor 27 to VVdd, which is implemented on Metal Layer 2. The voltage may then be distributed along the portion of Metal Layer 2 that implements VVdd and down various instances of vertical conductors 29 to functional circuits 12. These circuits in various embodiments may be implemented just beneath Metal Layer 3, which may be several metal layers below Metal Layer 2. Metal Layer 3, just below which the transistors of power switch 24 as well as those of functional circuits 12 are implemented, may be a bottom metal layer of the IC.

In the embodiment shown, includes a fourth metal layer (Metal Layer 4) implemented between Metal Layer 1 and Metal Layer 2. It is noted that Metal Layers 1, 2, and 4 are the top three metal layers in the embodiment shown, and this may apply to other embodiments as well. Metal Layer 4 in the embodiment shown (as with the other metal layers) is subdivided into portions. Some of the portions are physically and electrically coupled to the TVdd node. Other portions are physically and electrically coupled to the VVdd node, while still others implement and are coupled to a Vss node. As noted above, the metal layers may be subdivided into strips. In the embodiment shown, the strips of Metal Layer 4 are perpendicular to those of Metal Layers 1 and 2 (which run parallel to each other).

It is noted that while the various nodes (true voltage, virtual voltage) are shown on particular metal layers, other embodiments are possible and contemplated. For example, an embodiment wherein the true voltage node is not implemented on any metal layer, but instead only with one or more bumps. In some embodiments, the virtual voltage node could be implemented on the top metal layer. Embodiments are also possible and contemplate in which, e.g., the top metal layer is shared between true and virtual voltage nodes (and in some cases, with return nodes, e.g., Vss). In general, the true and virtual voltage nodes and their arrangement with respect to the various metal layers may be implemented in a wide variety of ways that fall within the scope of this disclosure, with these nodes being implemented on any suitable metal layer(s). Thus, FIG. 2, as well as various other drawings in this disclosure, are intended to be illustrative, but not limiting.

Figure 4:
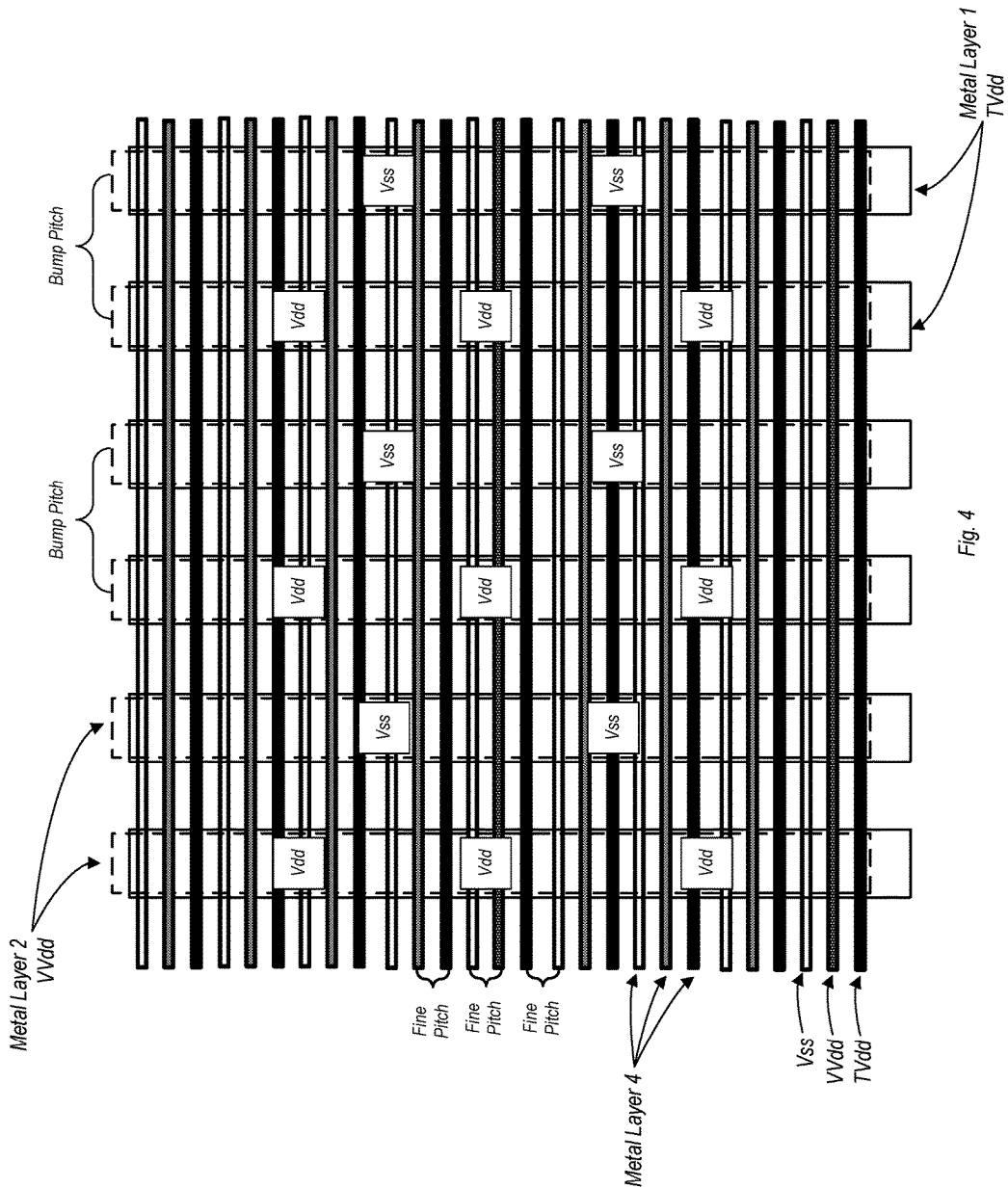
FIG. 4 is a plan view of one embodiment of an IC further illustrating the arrangement of the metal layers.

FIG. 4 illustrates additional details of the arrangement of the portions of Metal Layers 1, 2, and 4 per the embodiment of FIG. 3. As shown in the drawings, strips of Metal Layers 1 and 2 run parallel with one another. Furthermore, some strips of Metal Layer 1 are coupled to Vss bumps (instead of Vdd bumps) and thus these strips implement a Vss node (and are thus labeled 'Vss'). Each of the strips of Metal Layer 2 in the embodiment shown implement a VVdd node. In some embodiments, in which multiple power domains are present, at least some of the VVdd nodes may correspond to different power domains.

The various strips of Metal Layer 4 (which includes portions for TVdd, VVdd, and Vss) run perpendicular with respect to the strips of Metal Layers 1 and 2. It is further noted that the pitch (center-to-center distance) of the strips of Metal Layer 4 are substantially different than the pitch of the strips on Metal Layers 1 and 2. With respect to Metal Layers 1 and 2, the pitch between these layers is equivalent to the bump pitch, i.e. the horizontal distance (looking at the drawing) between a bump in one strip and a bump in the adjacent strip. In contrast, the pitch of the strips on Metal Layer 4 is a fine pitch, i.e. significantly smaller than the bump pitch of Metal Layers 1 and 2. The fine pitch of the various strips of Metal Layer 4 may provide a low resistive path for various transistors of IC 10 to access TVdd and/or VVdd.

Figure 5:
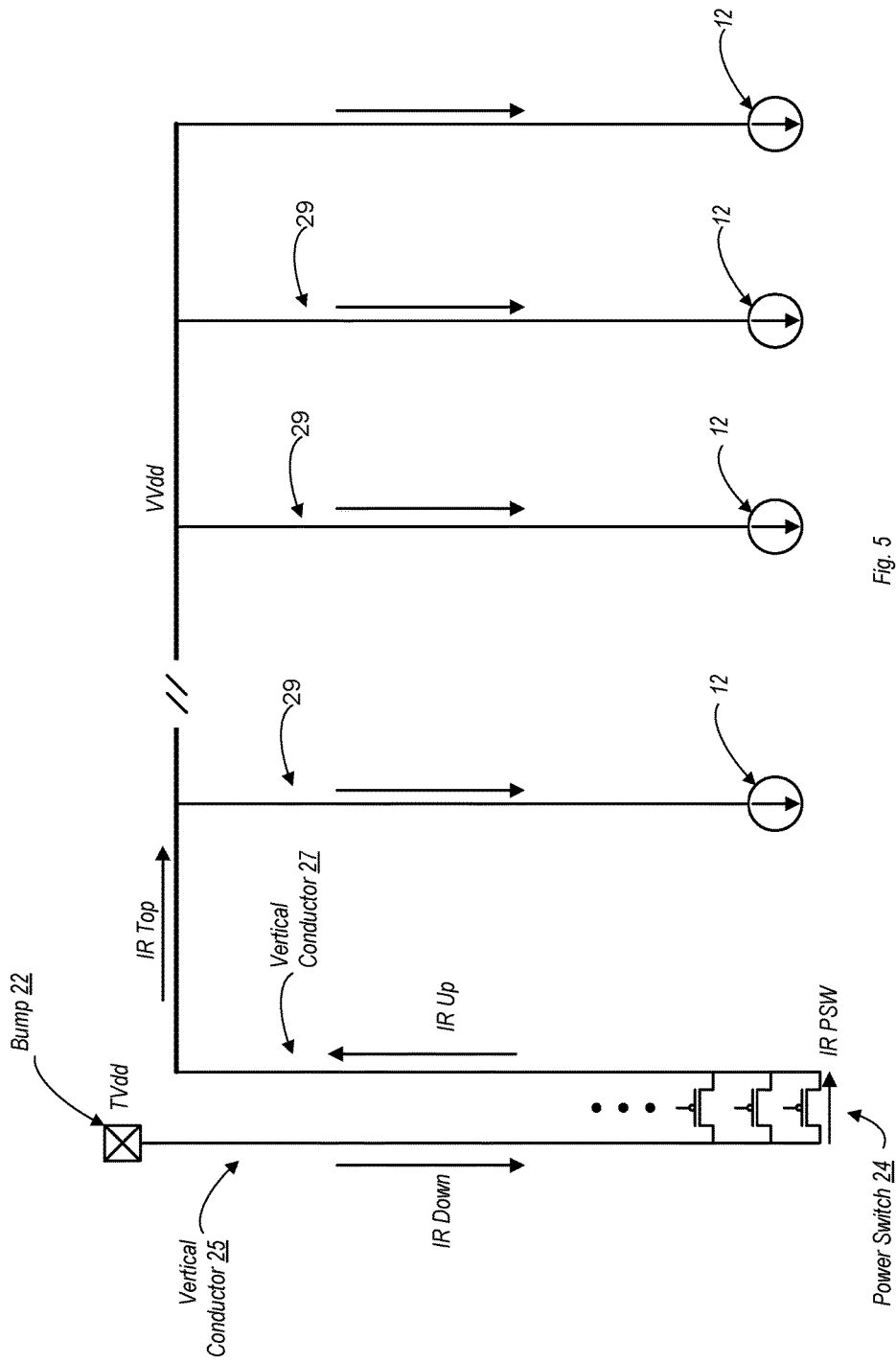
FIG. 5 is an illustration of a power distribution scheme for one embodiment of an IC.

FIG. 5 provides a further illustration of the power distribution scheme for one embodiment of an IC. More particularly, FIG. 5 illustrates the direction of current flow and power distributions from bump 22 on the surface of the IC to the functional circuits 12 (depicted here as current sources).

As discussed above, power switch 24 is implemented in a manner that it is placed directly and substantially under bump 22. When the transistors of power switch 24 are activated, they provide an electrical connection between separate portions of Metal Layer 3 to couple TVdd to VVdd. Power is transferred through the active transistors of power switch 24 from vertical conductor 25 to vertical conductor 27. From vertical conductor 27, power is transferred to the portion of VVdd on Metal Layer 2. From Metal Layer 2, power is transferred to the functional circuits 12 via correspondingly coupled vertical conductors 29.

The IR drops associated with the power transfer scheme shown in FIG. 5 are the initial IR Down (on vertical conductor 25), IR PSW (i.e. through the power switch) IR up (on vertical conductor 27), IR Top (on the portion of VVdd implemented on Metal Layer 2) and additional IR drops on the vertical conductors 29. This may result in more efficient power distribution. Power switch 24 (and thus the transistors thereof) may be placed directly underneath bump 22, instead of being distributed as in many prior art embodiments. This may result in less switch area overhead compared embodiments in which the switch is distributed.

Figure 6:
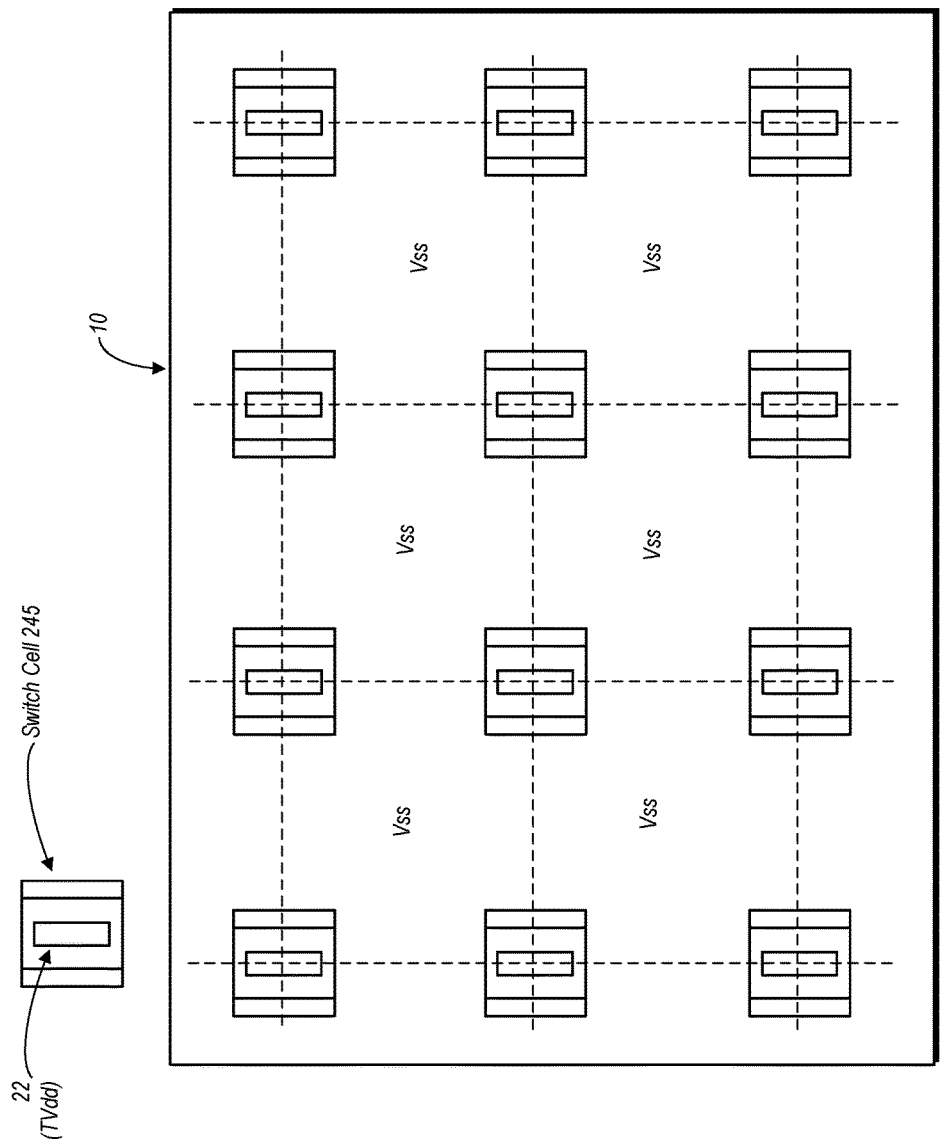
FIG. 6 is a top view of one embodiment of an IC utilizing the power distribution scheme of FIG. 4.

FIG. 6 is a top view of one embodiment of an IC utilizing the power distribution scheme of FIG. 5, and illustrates another aspect of the disclosure. In this particular embodiment, the various bumps 22 may be arranged in a grid, instead of in a random, layout driven manner. These bumps 22 may allow power to be connected at various points on the chip. As noted above, with power switches may each be implemented in a relatively small area directly underneath a corresponding bump 22. More particularly, the switches may be implemented within switch cell 245 instead of being distributed within various portion of IC 10.

The arrangement as shown in FIG. 6 may simplify the power distribution within IC 10. Distribution of power from True Vdd to Virtual Vdd may be accomplished in relatively small areas, due to the power switches 24 being implemented within the area defined by switch cell 242.

Figure 7:
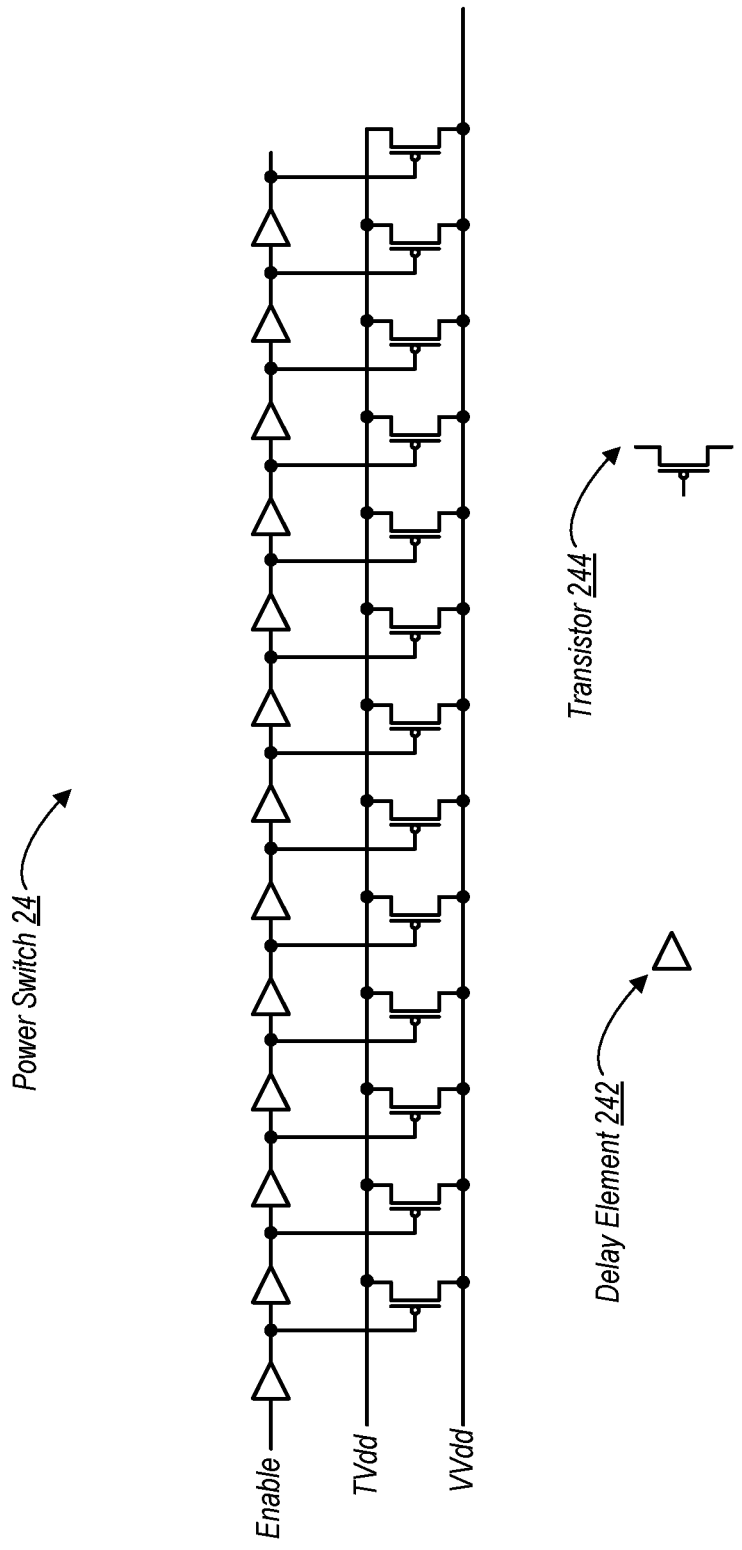
FIG. 7 is a schematic illustration of a power switch used in an embodiment of the power distribution scheme disclosed herein.

Turning now to FIG. 7, an exemplary embodiment of a power switch is shown. In the embodiment shown, power switch 24 includes a number of delay elements 242, the output of each of which is coupled to a gate terminal of a corresponding transistor 244. Each of the transistors 244 (shown here as PMOS devices) is coupled between TVdd and to VVdd.

The delay elements 242 in the embodiment shown form a serially-coupled chain. An enable signal (active low in this embodiment) may be received by a first delay element 242 in the chain and propagate from one to the next. As the enable signal is output from a given one of delay elements 242, its correspondingly coupled transistor 242 may be activated. Thus, the transistors 242 of power switch 242 are activated sequentially. The sequential activation may control the inrush of current onto the VVdd node, and thus to the functional circuits that receive power therefrom.

In some embodiments, power switch 24 may be separated into multiple, independent segments. For example, a first segment may include a small number of devices that are activated initially to allow the voltages on the two voltage nodes to move toward equalization, while limiting the current into the VVdd node. Thereafter, a second segment having a greater number of devices may begin activating these devices sequentially until the switch is fully active.

Figure 8:
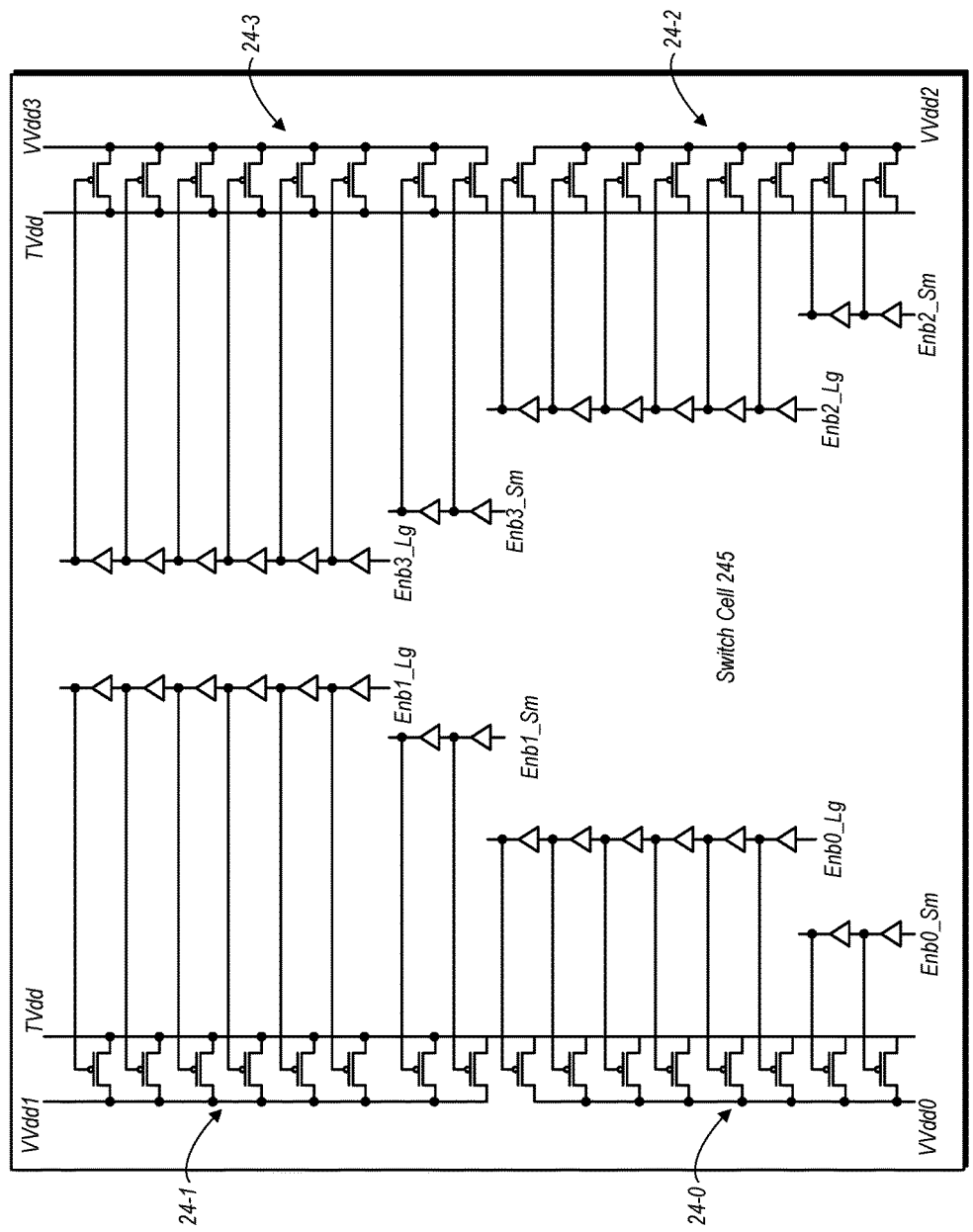
FIG. 8 is a top view of an exemplary switch cell implemented in one embodiment of the power distribution scheme of FIG. 4.

FIG. 8 is a diagram illustrating one embodiment of a switch cell that may be implemented directly under a bump as discussed above. In this particular embodiment, switch cell 245 actually includes four different power switches, each of which is associated with a separate virtual voltage domain. Thus, power switch 24-0 is configured to coupled TVdd to VVdd0, power switch 24-1 is configured to couple TVdd to VVdd1, power switch 24-2 is configured to couple TVdd to VVdd2, and power switch 24-3 is configured to couple TVdd to VVdd3. Enable signals to cause activation of these various power switches may be provided from an external source, e.g., from a power management circuit implemented elsewhere on the IC.

Additionally, each of the power switches in the embodiment shown is subdivided into multiple segments, a small segment and a large segment. For example, two devices of power switch 24-0 are arranged to be activated responsive to the active low enable signal Enb0_Sm, while the remainder of the devices are activated responsive to the active low enable signal Enb0_Lg. The small segment of power switch 24-0 may be activated first, allowing VVdd to being ramping up toward the voltage of TVdd, while also limiting the inrush current. Once the voltage on VVdd has ramped up a sufficient amount, the second segment of power switch 24-0 may begin activation.

Figure 9:
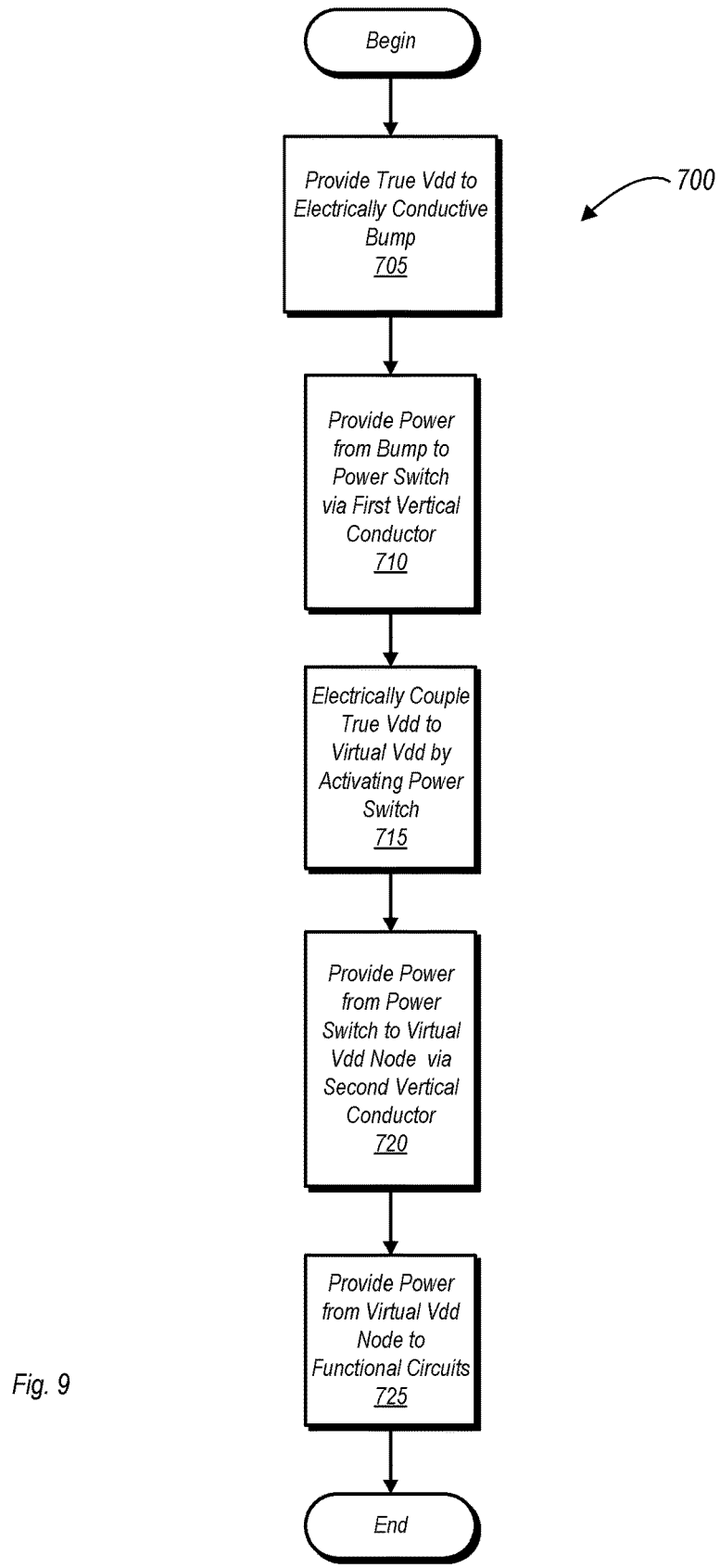
FIG. 9 is a flow diagram illustrating one embodiment of a method for distributing power in an IC.

FIG. 9 is a flow diagram of one embodiment of a method for distributing power in accordance with the various apparatus embodiments disclosed herein.

Method 700 begins with the providing of a voltage of a True Vdd node at an electrically conductive bump of an IC (block 705). The bump may be located on the surface of the IC, with a portion extending above the surface. Power may be provided from the bump to a power switch implemented directly below the bump, below the bottom metal layers of the IC, via a first vertical conductor (block 710).

The power provided from the True Vdd node may be coupled conveyed to a Virtual Vdd node by activation of the power switch (block 715). Power may then be conveyed via a second vertical conductor up to the portion of the Virtual Vdd node that implemented on one or more of the upper metal layers of the IC (block 720). From the Virtual Vdd node power may be provided to functional circuits in the corresponding voltage domain, via additional vertical conductors (block 725).

The power distribution scheme discussed herein may provide a number of advantages that are not present in prior art power distribution schemes. In relation to embodiments that utilize a distributed power switch, the area consumed by the power switch of the scheme disclosed herein may be smaller while still being able to obtain the same total power switch transistor width. Alternatively, the power switch transistor width may be reduced since the current through any given one of the devices is reduced due to current averaging effect in comparison with devices of a distributed power switch. Multiple leakage reduction techniques may be enabled by the consolidated power switch cell as discussed herein (e.g., gate biasing, back biasing, thick and/or long channel devices, or factors that would require a large area overhead for a distributed power switch). Compared to prior art embodiments that implement a ring-style power switch, where the ring opening size is typically larger than the bump pitch, IR drops may be smaller; also, Electro Migration (the transport of material caused by movement of ions in a conductor) may be smaller due to smaller current density. In prior art embodiments, bumps that are close to each vertical wire (to power switch) typically dominate the entire current supply for the block (e.g., for the demand current inside the ring), while the other bumps typically do not contribute as much current. Furthermore, in such embodiments, current may flow in two directions (e.g., opposite one another) in the higher metal, consequently, the wire width is narrower per direction thereby adding to both the IR drop and the electro migration. The use of wider metal in the power distribution network may reduce electro migration as current densities may be smaller.

Figure 10:
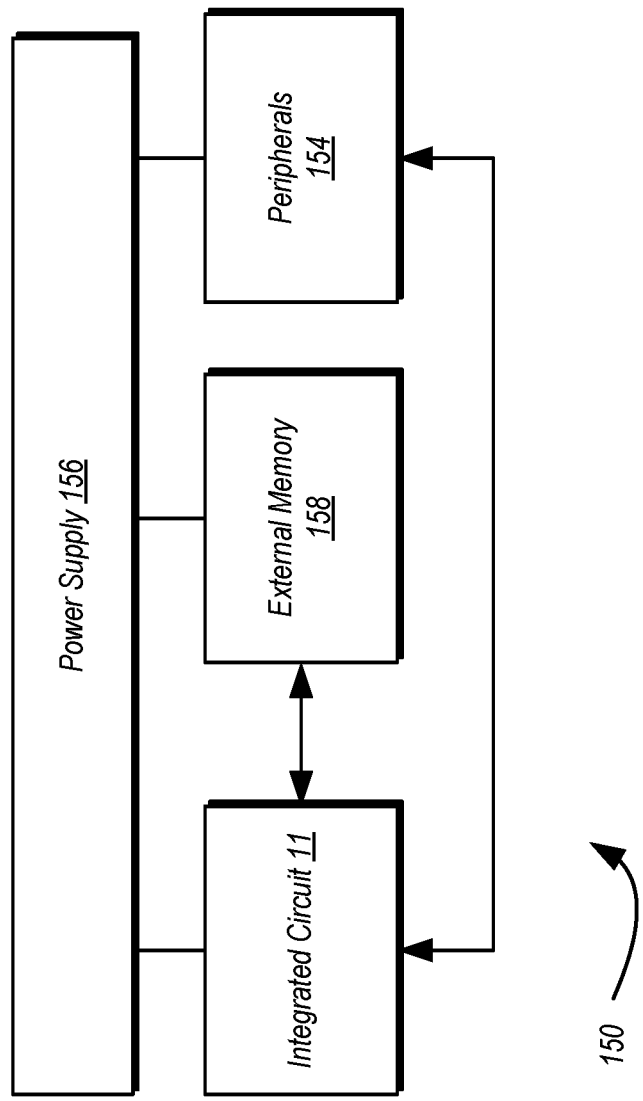
FIG. 10 is a block diagram of one embodiment of an exemplary system.

Turning next to FIG. 10, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   an electrically conductive bump on the surface of the integrated circuit and coupled to a true voltage supply node;
   a first virtual voltage supply node implemented on at least one metal layer; and
   a first power switch, wherein the first power switch is implemented directly below and is electrically connected to the electrically conductive bump by a first vertical conductor, and further coupled electrically to the virtual voltage supply node by a second vertical conductor, wherein the power switch is configured to, when active, electrically couple the true voltage supply node to the virtual voltage supply node.

2. The integrated circuit as recited in claim 1, comprising first, second, third, and fourth metal layers, wherein at least a portion of the first metal layer implements the true voltage supply node, wherein at least a portion of the second metal layer implements the virtual voltage supply node, wherein transistors of the power switch are implemented below the third metal layer, and wherein a first portion of the fourth metal layer is coupled to the true voltage supply node, wherein a second portion of the fourth metal layer is coupled to the virtual voltage supply node, and wherein a third portion of the fourth metal layer is coupled to a return path, and wherein the fourth metal layer is a next metal layer below the first metal layer.

3. The integrated circuit as recited in claim 2, wherein the first metal layer is a top metal layer of the integrated circuit, wherein the second metal layer is a next metal layer below the fourth metal layer, and wherein the third metal layer is a bottom metal layer.

4. The integrated circuit as recited in claim 2, wherein each of the first, second, and fourth metal layers are subdivided into strips of metal, wherein strips of metal of the first and second metal layers are parallel with respect to one another and separated by a first pitch, wherein strips of metal of the fourth layer are perpendicular with respect to those of the first and second metal layers and are separated by a second pitch that is less than the first pitch.

5. The integrated circuit as recited in claim 1, wherein the first power switch comprises a plurality of transistors that, when active, electrically couple the true voltage node to the virtual voltage node.

6. The integrated circuit as recited in claim 5, wherein the plurality of transistors each have a respective gate terminal coupled to a delay line configured to convey an enable signal, wherein the plurality of transistors is configured such that individual ones of the transistors are activated sequentially responsive to propagation of the enable signal through the delay line.

7. The integrated circuit as recited in claim 5, wherein each of the plurality of transistors of the first power switch are implemented in close physical proximity to one another.

8. The integrated circuit as recited in claim 1, further comprising a second virtual voltage node implemented on the second metal layer, the second virtual voltage node being separate from the first virtual voltage node, and a second power switch configured to, when active, electrically couple the second virtual voltage node to the true voltage node.

9. The integrated circuit as recited in claim 6, wherein the second power switch is implemented directly below and is electrically connected to the electrically conductive bump by the first vertical conductor, and is electrically connected to the second virtual voltage node by a third vertical conductor, and wherein the first and second power switches are independently controllable with respect to one another.

10. A method comprising:
providing power from an external source to an electrically conductive bump on the surface of and electrically coupled to a first metal layer of an integrated circuit, wherein the electrically conductive bump and the first metal layer implement a true voltage node; and
electrically coupling the true voltage node to a first virtual voltage node implemented on a second metal layer of the integrated circuit, wherein electrically coupling the true voltage node to the first virtual voltage node comprises activating a first power switch implemented directly under the electrically conductive bump on a third metal layer of the integrated circuit, and further comprises the first power switch receiving power from the true voltage node via a first vertical conductor coupled between the third metal layer and the electrically conductive bump, the first power switch being further coupled to the virtual voltage node via a second vertical conductor coupled between the third metal layer and the second metal layer.

11. The method as recited in claim 10, wherein the first metal layer is a top metal layer of the integrated circuit, and wherein the third metal layer is a bottom metal layer, and wherein the integrated circuit includes a fourth metal layer between the first and second metal layers, herein a first portion of the fourth metal layer is coupled to the true voltage supply node, wherein a second portion of the fourth metal layer is coupled to the virtual voltage supply node, and wherein a third portion of the fourth metal layer is coupled to a return path, and wherein the fourth metal layer is a next metal layer below the first metal layer and wherein the second metal layer is a next metal layer below the fourth metal layer.

12. The method as recited in claim 10, wherein electrically coupling the true voltage node to the virtual voltage node comprises sequentially activating a plurality of transistors of the power switch.

13. The method as recited in claim 10, further comprising electrically coupling the true voltage node to a second virtual voltage node implemented on the second metal layer of the integrated circuit, wherein electrically coupling the true voltage node to the second virtual voltage node comprises activating a second power switch implemented directly under the electrically conductive bump on the third metal layer of the integrated circuit, wherein the second power switch is electrically coupled to the second virtual voltage node by a third vertical conductor.

14. An integrated circuit comprising:
first, second, third and fourth metal layers, wherein the first layer is the uppermost layer of the integrated circuit, wherein the fourth metal layer is a next metal layer below the first metal layer, the second metal layer is a next layer below the fourth metal layer, and wherein the third metal layer is a bottom metal layer;
at least one electrically conductive bump implemented on the first metal layer, wherein the bump implements a true voltage supply node;
a power switch implemented on the third metal layer and underneath the bump, wherein the power switch is directly coupled to the electrically conductive bump by a first vertical conductor, and wherein, when enabled, the power switch is configured to, couple the true supply voltage node to a first part of a virtual supply voltage node implemented in part on the third metal layer; and
a second vertical conductor configured to couple the first part of the virtual supply voltage node to a second part of the virtual supply voltage node that is implemented on the second metal layer;
wherein the second part of the virtual supply voltage node, implemented on the second metal layer, is coupled to provide a supply voltage to one or more functional circuit blocks.

15. The integrated circuit as recited in claim 14, wherein the first power switch comprises a plurality of transistors that, when active, electrically couple the true voltage node to the virtual voltage node.

16. The integrated circuit as recited in claim 15, wherein the plurality of transistors each have a respective gate terminal coupled to a delay line configured to convey an enable signal, wherein the plurality of transistors is configured such that individual ones of the transistors are activated sequentially responsive to propagation of the enable signal through the delay line.

17. The integrated circuit as recited in claim 15, wherein each of the plurality of transistors of the first power switch are implemented in close physical proximity to one another.

18. The integrated circuit as recited in claim 14, further comprising a second virtual voltage node implemented on the second metal layer, the second virtual voltage node being separate from the first virtual voltage node, and a second power switch configured to, when active, electrically couple the second virtual voltage node to the true voltage node.

19. The integrated circuit as recited in claim 18, wherein the first and second power switches are independently controllable with respect to one another.

20. The integrated circuit as recited in claim 18, wherein the first virtual voltage node is coupled to distribute power to functional circuit blocks in a first power domain, and wherein the second virtual voltage node is coupled to distribute power to functional circuit blocks in a second power domain.

* * * * *